(12) United States Patent
Bao et al.

(10) Patent No.: US 6,885,024 B2
(45) Date of Patent: Apr. 26, 2005

(54) DEVICES WITH ORGANIC CRYSTALLITE ACTIVE CHANNELS

(75) Inventors: Zhenan Bao, Millburn, NJ (US); Howard Edan Katz, Summit, NJ (US); Christian Kloc, South Orange, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/256,885

(22) Filed: Sep. 27, 2002

(65) Prior Publication Data

US 2004/0061104 A1 Apr. 1, 2004

(51) Int. Cl.$^7$ .............................................. H01L 35/24
(52) U.S. Cl. ........................................ 257/40; 438/99
(58) Field of Search ............................. 257/40; 438/99

(56) References Cited

U.S. PATENT DOCUMENTS 6,265,243 B1 * 7/2001 Katz et al. .................... 438/99

OTHER PUBLICATIONS

Kagan, C.R. et al., "Patterning organic–inorganic thin–film transistors using microcontact printed templates," *Applied Physics Letters*, vol. 79, No. 21, pp. 3536–3538, Nov. 19, 2001.

Lin, Y.–Y. et al., "Stacked Pentacene Layer Organic Thin–Film Transistors with Improved Characteristics," *IEEE Electron Device Letters*, vol. 18, No. 12, pp. 606–608, Dec. 1997.

Jacobs, H.O. et al., "Submicrometer Patterning of Charge in Thin–Film Electrets," *Science*, vol. 291, pp. 1763–1766, Mar. 2, 2001.

Jacobs, H.O. et al., "Fabrication of a Cylindrical Display by Patterned Assembly," *Science*, vol. 296, pp. 323–325, Apr. 12, 2002.

Whitesides, G.M. et al., "Beyond molecules: Self–assembly of mesoscopic and macroscopic components," *PNAS*, vol. 99, No. 8, pp. 4769–4774, Apr. 16, 2002.

Hong, X.M. et al., "Thiophene–Phenylene and Thiophene–Thiazole Oligomeric Semiconductors with High Field–Effect transistor On/Off Ratios," *Chemistry of Materials*, vol. 13, No. 12, pp. 4686–4691, 2001.

Katz, H.E. et al., "a,ω–Dihexylquaterthiophene: A Second Thin Film Single–Crystal Organic Semiconductor," *Chemistry of Materials*, vol. 10, No. 2, pp. 457–459, Feb., 1998.

Laquindanum, J.G. et al., "Morphological Origin of High Mobility in Pentacene Thin–Film Transistors," *Chemistry of Materials*, vol. 8, No. 11, pp. 2542–2544, 1996.

Li, W. et al., "Field–Effect Transistors Based on Thiophene Hexamer Analogues with Diminished Electron Donor Strength," *Chemistry of Materials*, vol. 11, No. 2, pp. 458–465, 1999.

Dimitrakopoulos, C.D. et al., "Organic Thin Film Transistors for Large Area Electronics," *Advanced Materials*, vol. 14, No. 2, pp. 99–117, Jan. 16, 2002.

(Continued)

*Primary Examiner*—Sara Crane
(74) *Attorney, Agent, or Firm*—John F. McCabe

(57) ABSTRACT

A method fabricates ICs in which organic semiconductor crystallites serve as active channels of semiconductor devices. The method includes providing a substrate with a surface that has a preselected pattern of adhesion sites located thereon. The adhesion sites are prepared to adhere crystallites of an organic semiconductor. The method also includes applying a plurality of crystallites of the organic semiconductor to the surface to enable a portion of the applied crystallites to adhere at the prepared adhesion sites.

21 Claims, 3 Drawing Sheets

OTHER PUBLICATIONS

Horowitz, G. et al., "Field–Effect Transistor Made with a Sexithiophene Single Crystal," *Advanced Materials*, vol. 8, No. 1, pp. 52–54, 1996.

Parakka, J.P. et al., "Heterocyclic Heptamers Containing Thiophene and Pyrrole Units: Synthesis and Properties**," *Advanced Materials*, vol. 8, No. 1, pp. 54–59, 1996.

Klock, Ch; et al., *Physical vapor growth of centimeter–sized crystals of α–hexathiophene*, Reprinted from Journal of Crystal Growth, vol. 182, (1997), pp. 416–427.

Laudise, R.A., et al., *Physical vapor growth of organic semiconductors*, Reprinted from Journal of Crystal Growth, vol. 187, (1998), pp. 449–454.

Collet, J., et al., *Low–voltage, 30 nm channel length, organic transistors with a self–assembled monolayer as gate insulating films*, Applied Physics Letters, vol. 76, No. 14, Apr. 3, 2000, pp. 1941–1943.

Schon, J.H., et al., *Ambipolar Pentacene Field–Effect Transistors and Inverters*, Science, vol. 287, Feb. 11, 2000, pp. 1022–1023.

Schon, J.H., et al., *Surface and bulk mobilities of oligothiophene single crystals*, Applied Physics Letters, vol. 73, No. 24, Dec. 14, 1998, pp. 3574–3576.

* cited by examiner

DEVICES WITH ORGANIC CRYSTALLITE ACTIVE CHANNELS

BACKGROUND

1. Field of the Invention

This invention relates to organic semiconductor devices and methods for making such devices.

2. Description of the Related Art

One potential area of application for organic field-effect transistors (OFETs) is in driver circuits of pixel displays. In such circuits, the desirable properties for OFETs include a high channel mobility, compatibility with making fine patterns of OFETs, and a high on/off drain-current ratio, the off drain-current being produced by a zero gate voltage. While several conventional OFETs have one of the above desirable properties, conventional methods have not combined all three properties in the same device.

For example, OFETs made from single pentacene crystals have high channel mobilities, e.g., 1–5 centimeter-squared per volt second ($cm^2/Vs$) at room temperature. Unfortunately, these OFETs also have low on/off drain-current ratio, e.g., less than $10^5$. Also, OFETs based on single pentacene crystals have not lead to the formation of fine device patterns even though the devices based on pentacene crystals can have short channel lengths, e.g., less than 10 microns.

As a second example, organic semiconductor thin films are compatible with forming fine patterns of physically separated semiconductor domains, e.g., linear inter-domain dimensions of 5 microns or less. These fine patterns enable construction of fine patterns of OFETs on a substrate. Unfortunately, the organic semiconductor thin films are typically polycrystalline, and thus do not produce high channel mobilities. Exemplary thin film OFETs have channel mobilities of less than 0.2 $cm^2/Vs$ at room temperature. As opposed to polycrystalline thin films, crystalline thin films of organic semiconductors are not generally available for producing OFET channels.

SUMMARY

In one aspect, the invention features a method for making an integrated circuit (IC) in which organic semiconductor crystallites function as active channels of organic semiconductor devices. The method includes providing a substrate with a surface that has a preselected pattern of adhesion sites located thereon. The adhesion sites are prepared to adhere crystallites of an organic semiconductor. The method also includes applying a plurality of crystallites of the organic semiconductor to the surface to enable a portion of the applied crystallites to adhere at the prepared adhesion sites.

By using a preselected pattern of adhesion sites, the method is able to produce a fine resolution pattern of devices, e.g., organic field effect transistors (OFETs), even though the devices' active channels are previously prepared crystallites. Since the resulting semiconductor devices have channels of single organic semiconductor crystals, the undesirable effects of grain boundaries on the channel mobility and on/off drain-current ratio are avoided.

In another aspect, the invention features an IC. The IC includes a substrate having an array of OFETs. Each OFET includes an isolated crystallite of organic semiconductor, a gate structure, and conductive source and drain electrodes located on opposite ends of a channel portion of the crystallite. The crystallite is located on the substrate and is not connected to a crystallite of another transistor by a continuous pathway of crystallite material, i.e., the crystallites of different OFETs are isolated from each other. The gate structures are positioned to control conductivities of the channel portions of the crystallites.

DETAILED DESCRIPTION OF EMBODIMENTS

Herein, small single crystals with largest dimensions of 5 millimeters or less are referred to as crystallites. Exemplary crystallites have largest dimensions of 1 millimeter or less and preferably have smaller dimensions, e.g., 100 microns or less, so that such crystallites can form fine patterns on a substrate. Herein, an individual crystallite has a single crystalline domain, but the domains may include one or more cracks provided that the cracks do not separate the crystallite into more than one crystalline domain.

In an organic field effect transistor (OFET), a channel that is made from a single organic semiconductor crystal will typically have a higher mobility than a channel that is made from a polycrystalline organic semiconductor. The high mobility results, because the single crystal channel does not have grain boundaries. Grain boundaries lower conductivities and mobilities of OFET channels that are made from polycrystalline organic semiconductor films.

Presently, organic semiconductor crystallites with diameters of about 1 to 10 microns or more are readily available. Such organic semiconductor crystallites can be fabricated by methods described by R. A. Laudise et al in "Physical vapor growth of organic semiconductors" Journal of Crystal Growth 187 (1998) pages 449–454 and in "Physical vapor growth of centimeter-sized crystals of α-hexathiophene" Journal of Crystal Growth 182 (1997) pages 416–427. Both these articles of Laudise et al are incorporated herein by reference in their entirety. The methods described by Laudise et al include passing an inert gas over an organic semiconductor substrate that is maintained at a high enough temperature to evaporate organic semiconductor therefrom. The methods described by Laudise et al also include cooling down the gas saturated with organic semiconductor to cause an organic semiconductor crystallite to spontaneously condense. Such organic semiconductor crystallites can also be bought. For example, BASF Corporation of 3000 Continental Drive-North, Mount Olive, N.J. 07828-1234, sells pigment crystallites that are organic semiconductors. One such crystallite is formed of copper phthalocyanine. The ready availability of organic semiconductor crystallites enables the construction of OFETs with high quality channels.

Figure 1A:
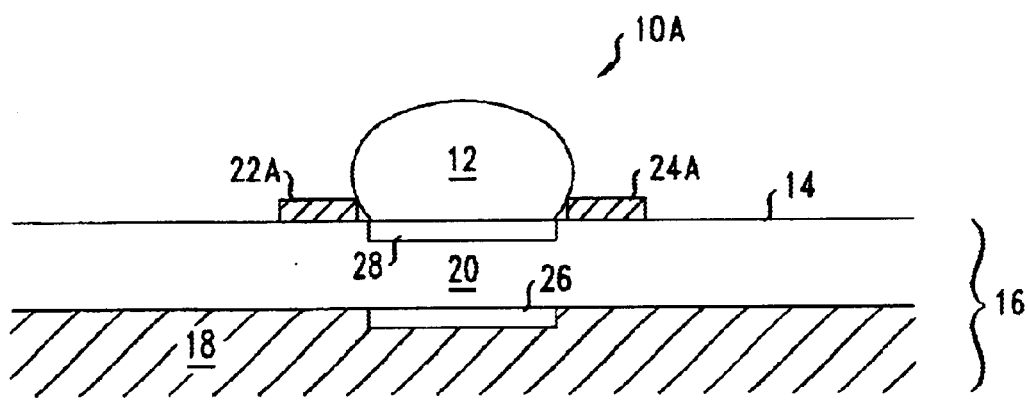
FIG. 1A shows a cross-sectional view of an organic field-effect-transistor (OFET) that is based on an organic semiconductor crystallite.

FIG. 1A shows an organic field-effect-transistor (OFET) 10A whose channel is a single organic semiconductor crystallite 12. The crystallite 12 rests on a nonconductive surface 14 of a substrate 16. The substrate 16 includes a matrix 18 and a dielectric top layer 20. The crystallite 12 rests on an adhesion region 28 located on the dielectric top layer 20 and is in physical contact with metal drain and source electrodes 22A, 24A that are deposited on the nonconductive surface 14 of the dielectric top layer 20. In some embodiments, the adhesion region 28 includes a chemical agent that binds the crystallite 12 thereto.

The substrate 16 also includes a conductive gate electrode 26 that is located below the dielectric top layer 20, i.e., the gate dielectric. The gate electrode 26 is located near the organic semiconductor crystallite 12 so that the voltage applied to the gate electrode 26 controls the conductivity of the crystallite 12.

Figure 1B:
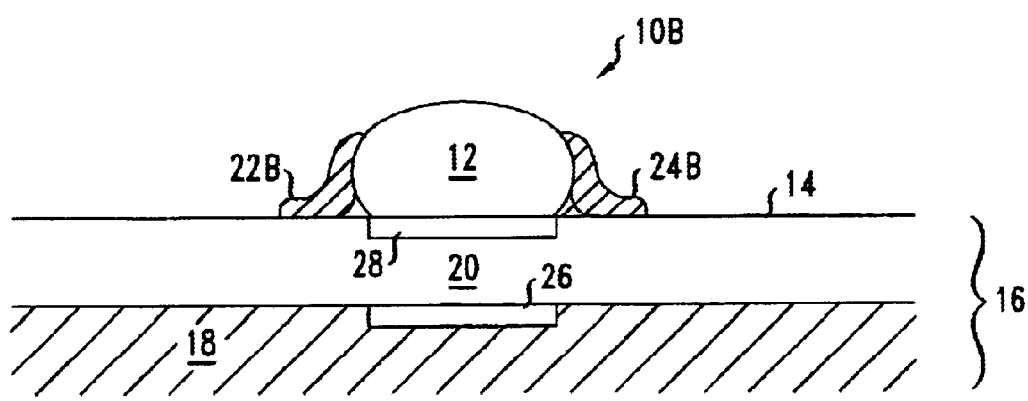
FIG. 1B is a cross-sectional view of another organic semiconductor crystallite-based OFET.

FIG. 1B shows another embodiment 10B of an OFET whose active channel is an organic semiconductor crystallite 12. The OFET 10B is substantially similar to the OFET 10A of FIG. 1A except that the drain and source electrodes 22B, 24B are deposited partially on the organic semiconductor crystallite 12 rather than only on the substrate 16 as shown in FIG. 1A.

In both OFETs 10A, 10B, a single doped or undoped organic semiconductor crystallite 12 rather than a polycrystalline thin film functions as the active channel.

In various embodiments, a plurality of the OFETs 10A, 10B of FIGS. 1A and/or 1B are located on the same substrate 16 to form a circuit, e.g., an array of drivers for a pixel display. The substrate 16 has features that enable forming fine patterns of the organic semiconductor crystallites. In such patterns, the organic semiconductor crystallites 12 of different OFETs are physically isolated so that a pathway of organic semiconductor does not connect the crystallites of separate OFETs.

Figure 2:
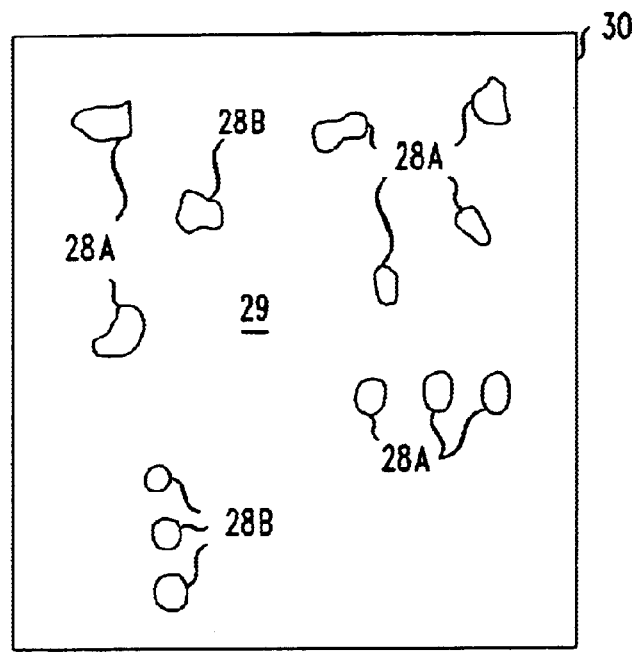
FIG. 2 is a top view of fabrication-substrate with adhesion sites for binding organic semiconductor crystallites during the fabrication of OFETs of an IC.

FIG. 2 shows a fabrication-substrate 30 for use in making an IC that has a plurality of the OFETs 10A, 10B, of the types shown in FIGS. 1A and/or 1B. The fabrication-substrate 30 has a surface that includes adhesion sites 28A, 28B and an adhesion site-free remainder 29. The adhesion sites 28A, 28B form a preselected pattern whose form depends on the final circuit to be constructed. During fabrication of the IC, crystallites preferably bind at the adhesion sites 28A, 28B and do not bind on the remainder 29 of the substrate.

Each adhesion site 28A, 28B includes one or more electrodes, e.g., buried gate electrode 26. At adhesion sites 28A for making the OFETs 10A shown in FIG. 1A, all three OFET electrodes 22A, 24A, 26 are present in the fabrication-substrate 30. At adhesion sites 28B for making the OFETs 10B shown in FIG. 1B, only the gate electrodes 26 are present in the fabrication-substrate 30. Both types of adhesion sites 28A, 28B are prepared to either electro-statically or chemically bind crystallites prior to fabrication of OFETs 10A, 10B on the fabrication-substrate 30.

In embodiments where the adhesion sites 28A, 28B electro-statically bind crystallites, preparing for OFET fabrication includes depositing an electrostatic charge on the crystallites and/or on the adhesion sites 28A, 28B or depositing charges on the crystallites and/or on the electrodes associated with the adhesion sites 28A, 28B by applying a voltage to the electrodes. In either case, a bound charge is present to attract and bind crystallites to the adhesion sites 28A, 28B during subsequent fabrication of OFETs. To hold the charge, some adhesion sites 28A, 28B incorporate an electret material.

The charge at adhesion sites 22A, 22B attracts oppositely charged crystallites when such crystallites are near one of the adhesion site 28A, 28B. The charge holds the crystallites at the adhesion sites 22A, 22B until the crystallites are permanently fixed thereto by another process. For example, the charge can hold the crystallites long enough to permanently fix the crystallites by an anneal process (see below).

In embodiments where the adhesion sites 28A, 28B chemically bind crystallites, functional chemical groups at the surface of the adhesion sites 28A, 28B produce an attractive force for binding crystallites thereto. Exemplary functional chemical groups include hydroxyl groups, carboxylic amide groups, and short alkyl chains (e.g., 1–6 carbons) with terminal hydroxyl or carboxylic amide groups. Such hydrophilic groups attract crystallites whose surfaces are also functionalized with hydrophilic groups.

In other embodiments where the adhesion sites 28A, 28B chemically bind crystallites, other functional chemical groups cover the adhesion site-free remainder 29 of the fabrication-substrate 30. These other functional chemical groups prevent adhesion of crystallites to the remainder 29 of the surface of the fabrication-substrate 30. For example, if the adhesion sites 28A, 28B have surfaces functionalized with hydrophilic functional groups, then the remainder 29 of the substrate's surface can be functionalized with hydrophobic functional groups. Then, the remainder 29 of the substrate's surface will not bind crystallites whose surfaces are functionalized with hydrophilic functional groups. Similarly, if the adhesion sites 28A, 28B have surfaces functionalized with aromatic rings, the remainder 29 of the substrate's surface can be functionalized with completely or partially fluorinated short alkyl chains (e.g., 1–6 carbons). Then, the adhesion sites will attract crystallites whose surfaces are covered with aromatic rings and such crystallites will not adhere to the adhesion site-free remainder 29 of the substrate's surface. In both examples, the organic semiconductor crystallites are only attracted to and bound at the adhesion sites 28A, 28B during the fabrication of OFETs.

In various embodiments, the fabrication-substrate 30 includes more than one species of adhesion site 28A, 28B. The presence of multiple species of adhesion sites 28A, 28B is useful in constructing complex circuits. For example, the various species of adhesion sites 28A, 28B can selectively adhere crystallites of different organic semiconductors. This selectivity enables constructing an IC in which various types of organic semiconductor channels are selectively distributed in the final circuit.

Figure 3:
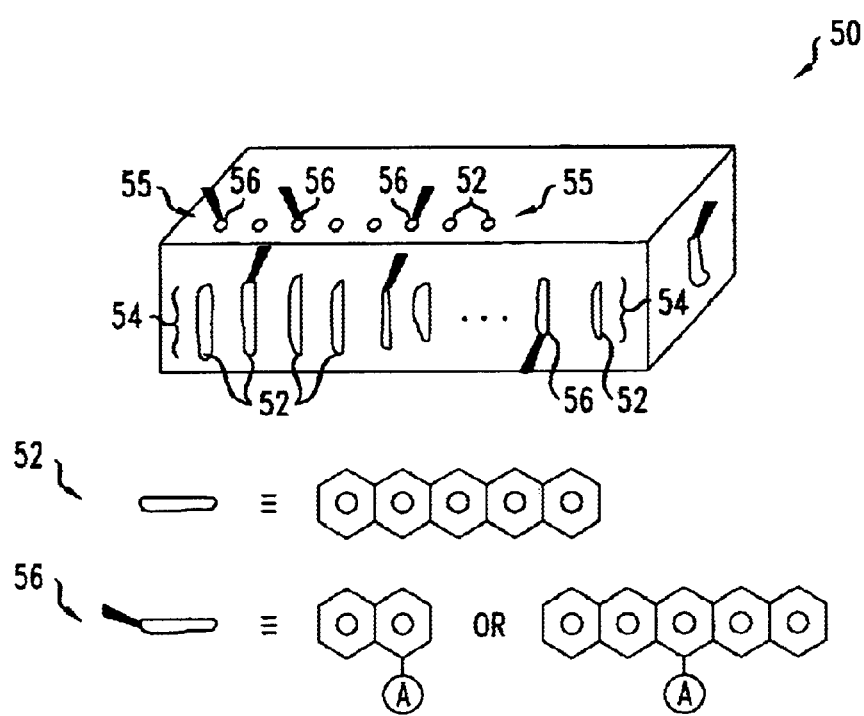
FIG. 3 shows a pentacene crystallite to which functional groups are attached.

FIG. 3 shows an exemplary pentacene crystallite 50 with a chemically functionalized surface. In the pentacene crystallite 50, pentacene molecules 52 line up in rows 54, 55 in which major axes of the pentacene molecules 52 have parallel orientations. On surfaces of the pentacene crystallite 50, specially functionalized aromatic molecules 56 occupy some positions in the rows 54, 55 of parallel oriented pentacene molecules 52. The functionalized aromatic molecules 56 include a portion of the pentacene molecular structure, i.e., two or more condensed aromatic rings, and one or more functional groups "A" that replace a hydrogen atom on one of the aromatic rings. Exemplary functional groups include hydroxyl groups, carboxylic amide groups, and short alkyl chains (e.g., 1–6 carbons) with terminal hydrophilic groups such as a hydroxyl group or a carboxylic amide-group. Structural similarity between the functionalized aromatic molecules 56 and the pentacene molecules 52 enables the functionalized aromatic molecules 56 to bind in unoccupied sites on the molecular pentacene crystal 50, i.e., surface sites. The functional groups "A" enable the functionalized aromatic molecules to bind to the adhesion sites 28A, 28B on the fabrication-substrate 30. One of skill in the art would be able to functionalize the pentacene crystal 50, as shown in FIG. 3 without performing undue experimentation.

Figure 4A:
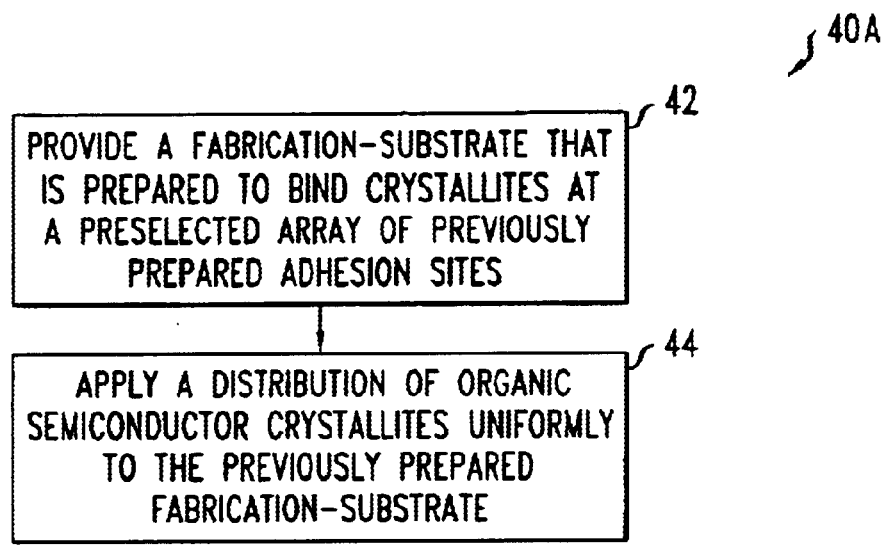
FIG. 4A is a flow chart illustrating a method for fabricating the crystallite based OFETs of FIGS. 1A and 1B.

FIG. 4A illustrates a method 40A for fabricating an IC with a plurality of the OFETs 10A and/or 10B of FIGS. 1A–1B. The method 40A uses the fabrication-substrate 30 shown in FIG. 2.

The method 40A includes providing a fabrication-substrate with a prepared surface on which an array of adhesion sites, i.e., the adhesion sites 22A and 22B of FIG. 2, are configured to adhere crystallites (step 42). The surface is prepared so that crystallites will either electro-statically or chemically bind to the adhesion sites as has already been described.

The method 40A includes applying a homogeneous distribution of previously fabricated organic semiconductor crystallites to the prepared fabrication-substrate (step 44). The crystallites are substantially single crystals with diameters in the range of about 10 microns to about 1000 microns. Such large single crystals are available, in part, because unlike organic semiconductor thin films, the previously fabricated organic semiconductor crystallites do not have to be grown on the lattice unmatched and/or heat-sensitive substrates. The application of the organic semiconductor crystallites to the surface of the substrate uses a printing, convection, or sedimentation process.

In the printing process, a stamp applies organic semiconductor crystallites to a sticky surface of the substrate. Exemplary stamps includes stamps with a flat sticky surface made of cross-linked polydimethylsiloxane. The printing process involves covering the sticky surface of the stamp with a uniform layer of crystallites, e.g., either by sprinkling crystallites onto the surface or by bringing the surface in contact with a uniform layer of crystallites. The printing process involves bringing the crystallite covered stamp surface in contact with the substrate. Bringing the stamp in contact with the substrate places a portion of the crystallites adjacent to adhesion sites that are prepared to bind crystallites. The printing also involves removing the stamp surface from the substrate. As the stamp is removed, the crystallites, which are bound at adhesion sites, will remain on the substrate, because the adhesion sites bind crystallites more strongly than the stamp. In some embodiments, a heat treatment lowers the adhesion of crystallites to the stamp's surface prior to removal of the stamp's surface from the substrate.

In the convection process, a fluid flow carries organic semiconductor crystallites suspended therein along the prepared surface of the substrate. The crystallite-laden fluid carries a portion of the crystallites close to adhesion sites. The attractive force between such sites and crystallites traps this portion of the crystallites at the adhesion sites.

In the sedimentation process, organic semiconductor crystallites are suspended in a viscous fluid and then, allowed to sediment out onto the substrate. During the sedimentation, the lateral distribution of crystallites becomes uniform so that the sedimentation produces a uniform covering of crystallites on the substrate. Some of the crystallites sediment onto adhesion sites, and the adhesion sites subsequently bind those crystallites.

Figure 4B:
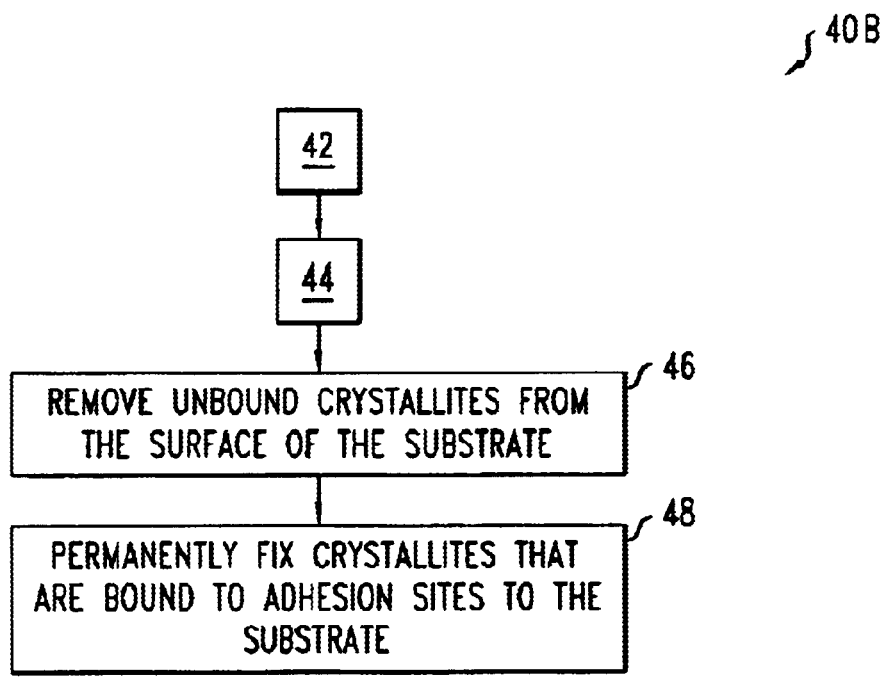
FIG. 4B is a flow chart illustrating a specific embodiment of the method shown in FIG. 4A.

FIG. 4B shows a specific method 40B for fabricating an IC that includes other steps in addition to the steps 42 and 44 already shown in FIG. 4A. The method 40B includes removing unbound crystallites on the surface of the substrate, e.g., removing the crystallites that are not located at adhesion sites 28A or 28B, (step 46). In the printing method, removing the unbound crystallites involves removing the surface of the stamp from the surface of the fabrication-substrate. Crystallites that are not bound by an adhesion site remain on the sticky stamp as the stamp is removed from the substrate. In the convection and sedimentation methods, removing the unbound crystallites involves removing the fluid from the substrate. Most or all unbound crystallites flow off with the fluid while the bound crystallites remain attached at adhesion sites. If unbound crystallites remain on the substrate after removal of the fluid, a supplemental step removes those remaining unbound crystallites. Exemplary supplementary steps include turning the substrate upside down after drying, vibrating the substrate after drying, or flowing a fluid over the substrate.

After removing unbound crystallites, the method 40B includes permanently fixing the remaining crystals to the substrate (step 48). One exemplary process permanently fixes the crystallites by baking the substrate. The bake softens surface layers of the substrate so that the bound crystallites seat more securely and are held more firmly in such layers. Another exemplary process deposits an adherent dielectric layer on the surface of the substrate to permanently encapsulate the bound crystallites and the substrate together.

In various embodiments, the method 40' includes performing further conventional semiconductor processing steps to form protective dielectric layers, metallic interconnect layers, and contacts for the devices (e.g., OFETs) previously fabricated on the substrate.

The OFETs produced by the above methods include active channels that are single crystalline channels. For that reason, these devices have channel mobilities and on/off drain-current ratios, which are not lowered due to the presence of grain boundaries. Thus, the OFETs typically have higher mobilities than OFETs based on polycrystalline organic semiconductor thin films. Furthermore, the above-described methods provide for fine resolution in formation of organic semiconductor channels of OFETs even though the channels are made of crystallites.

EXAMPLE 1

One exemplary method uses a semiconducting tetracene crystallite and a polystyrene-coated adhesion region to produce a crystallite-based OFET.

The method includes producing a fabrication-substrate from a doped silicon substrate with a 300 nanometer (nm) layer of silicon dioxide. One or more gate electrodes are located under the silicon dioxide layer, which functions as the gate dielectric for the one or more buried gate electrodes.

In the method, producing the fabrication-substrate includes forming one or more adhesion sites on the silicon dioxide coated silicon substrate. To form the adhesion sites, the method includes coating preselected adhesion regions on the substrate with a solution of toluene and 1 weight % (chlorophenyl) methyl dichlorosilane for a period of about ten minutes. Each adhesion region is selectively located over a gate electrode. The method includes spreading films of polystyrene dissolved in xylene over the adhesion regions on the substrate's surface. The previous coating promotes adhesion of polystyrene films to the coated adhesion regions. Next, a one-minute bake at 150° C. dries the polystyrene films so that the films adhere to the adhesion regions. The surfaces of the baked polystyrene films function as adhesion sites for binding organic semiconductor crystallites to the fabrication-substrate.

Next, the exemplary method includes forming a suspension of naphthacene crystallites in methanol and allowing the suspended crystallites to sediment onto the prepared substrate. Hereafter, naphthacene is referred to as tetracene. The sedimented tetracene crystallites adhere to the polystyrene coated sites.

The exemplary method also includes flowing the methanol off the substrate. During the removal of the methanol, tetracene crystallites located at polystyrene-coated adhesion sites do not flow off with the methanol, because the polystyrene binds those crystallites.

The exemplary method also includes baking the substrate at about 130° C. The bake softens the polystyrene films so that the bound tetracene crystallites more deeply seat therein. This permanently fixes the tetracene crystallites to the fabrication-substrate.

To finish OFET 10A of FIG. 1A, exemplary method includes evaporating metal drain and source electrodes onto the permanently fixed tetracene crystallite channels. During the evaporation, a mask controls the deposition of the electrodes on the crystallite.

To produce OFET 10B of FIG. 1B, the method also includes evaporating metal drain and source electrodes onto the various adhesion regions, e.g., immediately after forming the polystyrene films for binding the crystallites to the formation-structure.

EXAMPLE 2

Another exemplary method produces an IC with an array of OFETs having pentacene crystallite channels. The exemplary method includes coating the adhesion sites 28A, 28B on the fabrication-substrate 30 of FIG. 2 with polystyrene, which adheres pentacene. The exemplary methods also includes functionalizing the adhesion site-free remainder 29 of the fabrication-substrate's surface with either fluorinated alkyl groups or a fluorinated polymer such as polytetrafluoroethylene (TEFLON™). The method includes depositing the pentacene crystallites are on the functionalized surface of the fabrication-substrate 30 by one of two sedimentation processes. In the first sedimentation process, the pentacene crystallites are suspended in hexane and then, allowed to sediment out of the hexane onto the fabrication-substrate 30. The previous functionalization causes the hexane to not wet the adhesion site-free remainder 29 of the surface of the fabrication-substrate 30 so that pentacene crystallites only sediment onto the adhesion sites 28A, 28B wetted by the hexane. After the sedimentation, an evaporation step removes remaining hexane. In the second sedimentation process, the pentacene crystallites are allowed to fall through air onto the fabrication-substrate 30. While pentacene crystallites do adhere to adhesion sites 28A, 28B, the crystallites not adhere to the fluorinated remainder 29 of the surface of the fabrication-substrate 30.

After the sedimentation deposition of pentacene crystallites, the method includes performing a bake that permanently fixes the pentacene crystallites to the adhesion sites 28A, 28B, e.g., a 5 minute bake at about 130° C. Then, the substrate 30 is simply rotated 90 degrees and shaken against a fixed object to dislodge the portion of the crystallites from the adhesion site-free remainder 29 of the fabrication substrate. Since pentacene does not adhere to fluorinated surfaces, the shake dislodges the pentacene crystallites not located at polystyrene-coated adhesion sites 28A, 28B. The remainder of the preparation of the pentacene crystallite-based IC is substantially identical to the method of Example 1.

Other embodiments of the invention will be apparent to those of skill in the are in light of the specification, drawings, and claims of this application.

What we claim is:

1. A method, comprising:
providing a substrate whose surface has a preselected pattern of adhesion sites located thereon, the adhesion sites being prepared to adhere crystallites of an organic semiconductor; and
applying a plurality of crystallites of the organic semiconductor to the surface to enable a portion of the applied crystallites to adhere to at least a portion of the prepared adhesion sites.

2. The method of claim 1, wherein portions of the surface between the adhesion sites are functionalized with functional groups that do not adhere the crystallites of the organic semiconductor.

3. The method of claim 2, wherein the portions are functionalized with fluorinated functional groups.

4. The method of claim 1, wherein surfaces of the adhesion sites are functionalized with functional groups that adhere the crystallites of the organic semiconductor.

5. The method of claim 4, wherein surfaces of the crystallites of the organic semiconductor are functionalized with functional groups that bind to the adhesion sites.

6. The method of claim 5, wherein the surfaces of the adhesion sites and crystallites are one of both functionalized with aromatic groups and both functionalized with hydrophilic groups.

7. The method of claim 1, wherein the providing includes electrically charging the adhesion sites to attract a portion of charged ones of the crystallites.

8. The method of claim 1, wherein a portion of the adhesion sites have gate electrodes associated with the adhesion sites.

9. The method of claim 8, wherein the providing further comprises charging the gate electrodes to enable the associated adhesion sites to bind a portion of the charged ones of the crystallites.

10. The method of claim 1, wherein the applying comprises causing a fluid to transport the crystallites of the organic semiconductor over the surface.

11. The method of claim 1, wherein the applying comprises causing the crystallites of the organic semiconductor to sediment through a fluid onto the surface.

12. The method of claim 1, wherein the applying comprises:
causing the crystallites of organic semiconductor to adhere to a surface of a stamp; and
bringing the surface of the stamp in contact with the surface of the substrate.

13. The method of claim 1, further comprising:
then, removing from the surface ones of the crystallites that are unbound at adhesion sites; and
fixing to the surface ones of the crystallites that are bound at the adhesion sites.

14. An integrated circuit, comprising:
a substrate and an array of organic field effect transistors on the substrate, each transistor comprising:
a crystallite of organic semiconductor that is located over the substrate;
a gate structure positioned to control a conductivity of a channel portion of the crystallite; and
conductive source and drain electrodes located on opposite ends of the channel portion; and
wherein the largest dimension of each crystallite is 1 millimeter or less.

15. The integrated circuit of claim 14, wherein the gate structure includes a gate electrode that is located in the substrate.

16. An integrated circuit, comprising:

a substrate and an array of organic field effect transistors located on the substrate, each transistor comprising:

a crystallite of organic semiconductor that is located over the substrate;

a gate structure positioned to control a conductivity of a channel portion of the crystallite; and conductive source and drain electrodes located on opposite ends of the channel portion; and a pattern of separated adhesion sites, each adhesion site interposed between a region of the substrate and an associated one of the crystallites, the adhesion sites having a chemical composition configured to bind the crystallites to the substrate.

17. The integrated circuit of claim 14, wherein different ones of the transistors have channels that are physically isolated from each other.

18. The integrated circuit of claim 14, wherein the conductive source and drain electrodes are located on the substrate.

19. The integrated circuit of claim 14, wherein the crystallite of each transistor is physically isolated from the crystallites of the remaining one or more transistors.

20. The integrated circuit of claim 19, wherein the crystallites have largest dimensions of 100 microns or less.

21. The integrated circuit of claim 16, wherein the largest dimension of each crystallite is 1 millimeter or less.

* * * * *